US009749020B2

(12) United States Patent
Kuroda

(10) Patent No.: US 9,749,020 B2
(45) Date of Patent: Aug. 29, 2017

(54) INTEGRATED CIRCUIT AND LAYERED CIRCUIT PROVIDED THEREWITH

(71) Applicant: ThruChip Japan, Inc., Tokyo (JP)

(72) Inventor: Tadahiro Kuroda, Kanagawa (JP)

(73) Assignee: ThruChip Japan, Inc., Tokyo (JP)

( * ) Notice: Subject to any disclaimer, the term of this patent is extended or adjusted under 35 U.S.C. 154(b) by 0 days.

(21) Appl. No.: 14/905,406

(22) PCT Filed: Nov. 11, 2014

(86) PCT No.: PCT/JP2014/079830
§ 371 (c)(1),
(2) Date: Jan. 15, 2016

(87) PCT Pub. No.: WO2015/076153
PCT Pub. Date: May 28, 2015

(65) Prior Publication Data
US 2016/0156390 A1    Jun. 2, 2016

(30) Foreign Application Priority Data

Nov. 21, 2013   (JP) ................................. 2013-241386

(51) Int. Cl.
*H04B 5/00*   (2006.01)
*H01L 23/522*   (2006.01)
(Continued)

(52) U.S. Cl.
CPC ....... *H04B 5/0081* (2013.01); *H01F 27/2804* (2013.01); *H01L 23/5227* (2013.01);
(Continued)

(58) Field of Classification Search
CPC ..... H04B 5/0081; H04B 5/0087; H01F 17/00; H01F 27/00; H01L 23/5227; H01L 23/5283

See application file for complete search history.

(56) References Cited

U.S. PATENT DOCUMENTS 5,394,087 A * 2/1995 Molyneaux .......... G01R 33/365
324/318
6,868,244 B2 * 3/2005 Koide .................. G03G 15/757
310/153

(Continued)

FOREIGN PATENT DOCUMENTS

JP    2004-229406    8/2004
JP    2005-228981    8/2005
(Continued)

OTHER PUBLICATIONS

International Search Report dated Feb. 10, 2015.
(Continued)

*Primary Examiner* — Tuan Pham
(74) *Attorney, Agent, or Firm* — IPUSA, PLLC

(57) ABSTRACT

An integrated circuit includes multiple quadrangular coils including a first wiring and a second wiring that are alternately connected to each other and formed on different layers in a manner perpendicularly intersecting each other. The coils are partly overlapped with each other in a diagonal direction that connects opposite corners of the coils. The coils preferably have the same structures. A target coil among the coils preferably partly overlaps with another coil among the coils in two diagonal directions that connect opposite corners of the target coil.

9 Claims, 7 Drawing Sheets

(51) Int. Cl.
  *H01L 23/528* (2006.01)
  *H01F 27/28* (2006.01)
(52) U.S. Cl.
  CPC ...... *H01L 23/5283* (2013.01); *H04B 5/0031* (2013.01); *H01F 2027/2809* (2013.01); *H01L 2924/0002* (2013.01)

(56) References Cited

U.S. PATENT DOCUMENTS

| | | | | |
|---|---|---|---|---|
| 7,671,504 | B2* | 3/2010 | Rohrer | H02K 3/47 |
| | | | | 310/179 |
| 2007/0289772 | A1 | 12/2007 | Kuroda et al. | |
| 2009/0079387 | A1* | 3/2009 | Jin | H02J 7/0004 |
| | | | | 320/108 |
| 2011/0090036 | A1 | 4/2011 | Kuroda | |
| 2011/0260808 | A1 | 10/2011 | Uchida | |
| 2013/0175983 | A1* | 7/2013 | Partovi | H01F 5/003 |
| | | | | 320/108 |
| 2013/0300505 | A1* | 11/2013 | Kondo | H03F 1/0272 |
| | | | | 330/255 |

FOREIGN PATENT DOCUMENTS

| | | |
|---|---|---|
| JP | 2009-277842 | 11/2009 |
| JP | 2011-233956 | 11/2011 |
| JP | 2012-209769 | 10/2012 |
| WO | 2006/117834 | 11/2006 |
| WO | 2009/139372 | 11/2009 |

OTHER PUBLICATIONS

N.Miura, D.Mizoguchi, T.Sakurai and T.Kuroda,"Cross Talk Countermeasures in Inductive Inter-Chip Wireless Superconnect", in Proc. IEEE Custom Integrated Circuits Conference(CICC'04),pp. 99-102, Oct. 2004

Noriyuki Miura, Tadahiro Kuroda, "Low-Power and Wideband Inductive-Coupling Communication for 3D Integration", Journal of Japan Institute of Electronics Packaging, vol. 11, Renshi Sawada, Japan Institute of Electronics Packaging, May 1, 2008 (May 1, 2008), pp. 174 to 181, with English Abstract.

* cited by examiner

INTEGRATED CIRCUIT AND LAYERED CIRCUIT PROVIDED THEREWITH

TECHNICAL FIELD

The present invention relates to an integrated circuit and a layered circuit provided therewith.

BACKGROUND ART

In recent years, a large capacity layered-type semiconductor memory device having multiple semiconductor memories layered thereon is developed to allow the semiconductor memory device to be controlled from outside in the same manner as controlling a single semiconductor memory. For example, a Solid State Drive (SSD) using a non-volatile memory instead of a magnetic hard disk can have its memory capacity increased by layering multiple flash memory chips of the same kind.

The connection and power supply between the chips of the layered-type semiconductor memory device may be performed, for example, by using wirings. However, the use of wiring makes high-densification/high integration of the semiconductor device difficult.

Thus, technology for wirelessly connecting multiple layers of chips and multiple layers of printed circuit boards in a layered type device is being developed. For example, there is a technology of performing communications by inductive coupling between layered chips or substrates by using coils of the wiring of a semiconductor integrated circuit chip or an electronic circuit substrate (see, for example, Patent Document 1, Patent Document 2, and Non-Patent Document 1).

In Patent Document 1, wireless data communication can be performed by utilizing inductive coupling of a pair of coils between layers of chips (substrates). The coils are formed by the wiring provided on a chip. In Patent Document 2, magnetic communication between semiconductor chips can be performed by utilizing coils having alternately connected wirings that are formed on different layers in a manner perpendicularly intersecting each other.

In Non-Patent Document 1, data communication by way of inductive coupling can be performed by utilizing coils arranged with a predetermined pitch.

RELATED ART DOCUMENT

Patent Document

Patent Document 1: Japanese Laid-Open Patent Publication No. 2005-228981
Patent Document 2: Japanese Laid-Open Patent Publication No. 2009-277842

Non-Patent Document

Non-Patent Document 1: N. Miura, D. Mizoguchi, T. Sakurai, and T. Kuroda, "Cross Talk Countermeasures in Inductive Inter-Chip Wireless Superconnect", In Proc. IEEE Custom Integrated Circuits Conference (CICC 94), pp. 99-102, October 2004.

DISCLOSURE OF THE INVENTION

Problem to be Solved by Invention

In the case of Non-Patent Document 1, multiple rectangular coils are arranged at a predetermined pitch in a matrix-like shape along a direction in which its wiring is arranged. Because the data communication rate proportionally increases in accordance with the number of coils that are arranged, it becomes necessary to increase the density of mounting coils in order to satisfy the growing demand for faster communication rates.

However, with the technology of non-patent document 1 that has a coil arranged along a direction in which its wiring is arranged, cross-talk between adjacent coils increases when the density for mounting the coils is increased by reducing the pitch of the coil in the wiring direction. Therefore, increasing the mounting density of coils is limited.

Thus, one aim of the present invention is to provide an integrated circuit and a layered circuit provided therewith for reducing cross-talk between adjacent coils and increasing the mounting density of coils.

Means for Solving Problem

According to one aspect, there is provided an integrated circuit including plural quadrangular coils including a first wiring and a second wiring that are alternately connected to each other and formed on different layers in a manner perpendicularly intersecting each other. The coils are partly overlapped with each other in a diagonal direction that connects opposite corners of the coils.

Effect of Invention

According to an aspect of the present invention, cross-talk between adjacent coils can be prevented and coils can be mounted with high density.

EMBODIMENTS FOR CARRYING OUT THE INVENTION

In the following, embodiments of the present invention are described with reference to the accompanying drawings.

Figure 1:
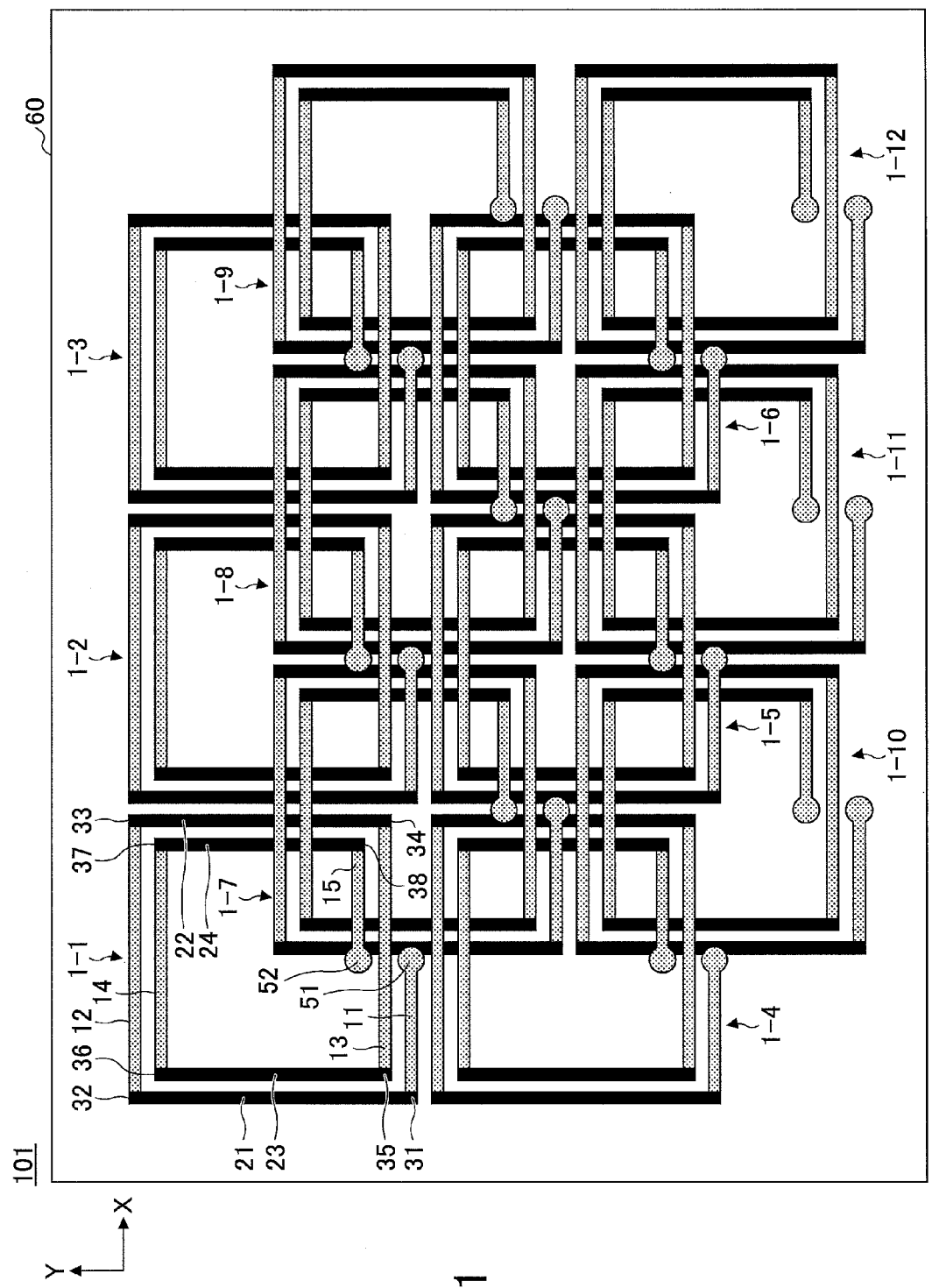
FIG. 1 is a schematic diagram illustrating an exemplary configuration of an integrated circuit.

FIG. 1 is a schematic diagram illustrating an exemplary configuration of a semiconductor integrated circuit 101. The semiconductor integrated circuit 101, which is an example of an integrated circuit, includes a substrate 60 and multiple coils formed on the substrate 60. Twelve coils 1-1 to 1-12 are illustrated in FIG. 1. Note that the outer shape and area of the substrate 60 is discretional.

The coils 1-1 to 1-12 have quadrate shapes and include first and second wiring that are alternately connected to each other and formed on different layers in a perpendicularly intersecting manner. In FIG. 1, for example, a first wiring that is formed on a first layer is illustrated with a black solid line, and a second wiring is formed on a second layer (different from the first layer) in a manner perpendicularly intersecting the first wiring and is illustrated with a satin-finished solid line.

For example, the first layer on which the first wiring is formed is a layer below the second layer on which the second wiring is formed. For example, in a case where the number of first layers is an odd number, the number of second layers is an even number, and in a case where the number of second layers is an even number, the number of first layers is an odd number. The first and second layers may be adjacent to each other. Alternatively, the first and second layers may be separated from each other to have one or more layers interposed therebetween.

Each of the coils 1-1 to 1-12 have the same structure. Therefore, a structure of one of the coils 1-1 to 1-12 is described with reference to FIG. 2.

Figure 2:
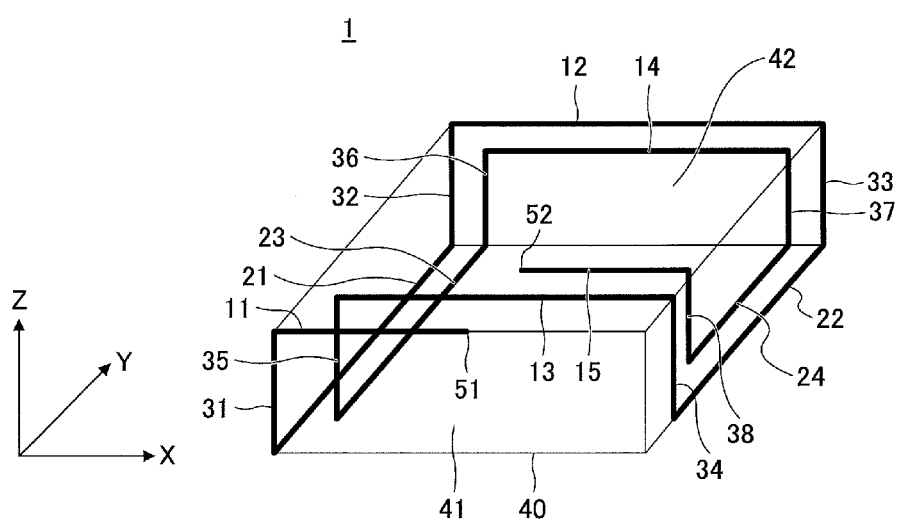
FIG. 2 is a schematic diagram illustrating an exemplary configuration of a coil.

FIG. 2 is a schematic diagram illustrating an exemplary configuration of one coil 1 among the coil 1-1 to coil 1-12. In FIG. 2, the first wiring corresponds to wirings 21, 22, 23, 24 that are formed on a first wiring layer 41 parallel to the X-Y plane, and the second wiring corresponds to wirings 11, 12, 13, 14, 15 that are formed on a second wiring layer parallel to the X-Y plane. The wirings on opposite sides are formed on the same wiring layer. Further, vias 31 to 38 are conductive lines that connect one end of the first wiring and one end of the second wiring.

As illustrated in FIG. 2, the multiple thin lines 40 that are parallel to an extending direction of each wiring or via are imaginary lines for facilitating the viewablity of the layer structure of the coil.

The coil 1 has a single wound configuration having both ends provided with a coil end 51 and a coil end 52, respectively. One end of the wiring 11 that is provided with the coil end 51 on the other end is connected to one end of the wiring 21 by way of the via 31. The other end of the wiring 21 is connected to one end of the wiring 12 by way of the via 32. The other end of the wiring 12 is connected to one end of the wiring 22 by way of the via 33. The other end of the wiring 22 is connected to one end of the wiring 13 by way of the via 34. The other end of the wiring 13 is connected to one end of the wiring 23 by way of the via 35. The one end of the wiring 24 is connected to one end of the wiring 14 by way of the via 36. The other end of the wiring 14 is connected to one end of the wiring 24 by way of the via 37. The other end of the wiring 15 is connected to one end of the wiring 15 by way of the via 38. The other end of the wiring 15 is the coil end 52. Accordingly, the coil 1 is formed by alternately connecting the first wiring and the second wiring.

In a case of observing the first wiring layer 41 from an X-Y plan view, the above-described coil 1 enables a wiring to be formed on the first wiring layer 41 in a manner traversing at least one of the wirings 11 to 15 (formed on the second wiring layer 42 in the X-direction) in the Y-direction. Similarly, in a case of observing the second wiring layer 42 in the X-Y plan view, the coil 1 enables a wiring to be formed on the second wiring layer 42 in a manner traversing at least one of the wirings 21 to 24 (formed on the first wiring layer 41 in the Y-direction) in the X direction.

As illustrated in FIG. 1, multiple coils, that are partly overlapped in a diagonal direction connecting their opposite corners, are formed on the substrate 60. For example, the coil 1-1 and the coil 1-7 are partly overlapped in a diagonal direction connecting the via 32 and the via 34 positioned at the opposite corners of the coil 1-1 or the coil 1-7. For example, the coil 1-2 and the coil 1-7 are partly overlapped in a diagonal direction connecting the via 31 and the via 33 positioned at the opposite corners of the coil 1-2 or the coil 1-7. Similarly, other combinations of coils are also partly overlapped in a diagonal direction.

Accordingly, because multiple coils that are partly overlapped in a diagonal direction connecting their opposite corners can be formed on the substrate 60, the density of coils per unit area of the substrate 60 can be increased. As a result, the communication rate of data communication utilizing inductive coupling between coils can be increased for multiple semiconductor integrated circuits arranged in a vertical direction (Z-direction).

The corner parts on both sides of a wiring constituting a single side of the quadrangular shaped coil have less magnetic field compared to a center part of the wiring constituting the single side of the coil. Therefore, even if adjacent coils partly overlap in the diagonal direction, cross-talk between the adjacent coils (e.g., between coil 1-1 and coil 1-7) that partly overlap in the diagonal direction can be prevented.

Because each of the coils formed on the substrate have the same structure (e.g., dimension and layer configuration of wiring), each of the coils can be efficiently arranged on the substrate 60. Therefore, the coils can be mounted with greater density.

For example, supposing that the coil 1-7 is a target coil whereas the other coils are the coils 1-1, 1-2, 1-4, and 1-5, the coil 1-7 partly overlaps with each of the four coils 1-1, 1-2, 1-4, and 1-5 in a diagonal direction connecting two opposite corners of the coil 1-7. The two diagonal directions connecting the opposite corners of the coil 1-7 are the first diagonal direction connecting the via 32 and the via 34 of the coil 1-7 and the second diagonal direction connecting the via 31 and the via 33 of the coil 1-7.

Similarly, supposing that the coil 1-5 is a target coil whereas the other coils are the coils 1-7, 1-8, 1-10, and 1-11, the coil 1-5 partly overlaps with each of the four coils 1-7, 1-8, 1-10, and 1-11 in a diagonal direction connecting two opposite corners of the coil 1-5. The two diagonal directions connecting the opposite corners of the coil 1-5 are the first diagonal direction connecting the via 32 and the via 34 of the coil 1-5 and the second diagonal direction connecting the via 31 and the via 33 of the coil 1-5.

The overlapping relationships between the target coil and the other coils in the diagonal direction also apply to the other coils.

Figure 3:
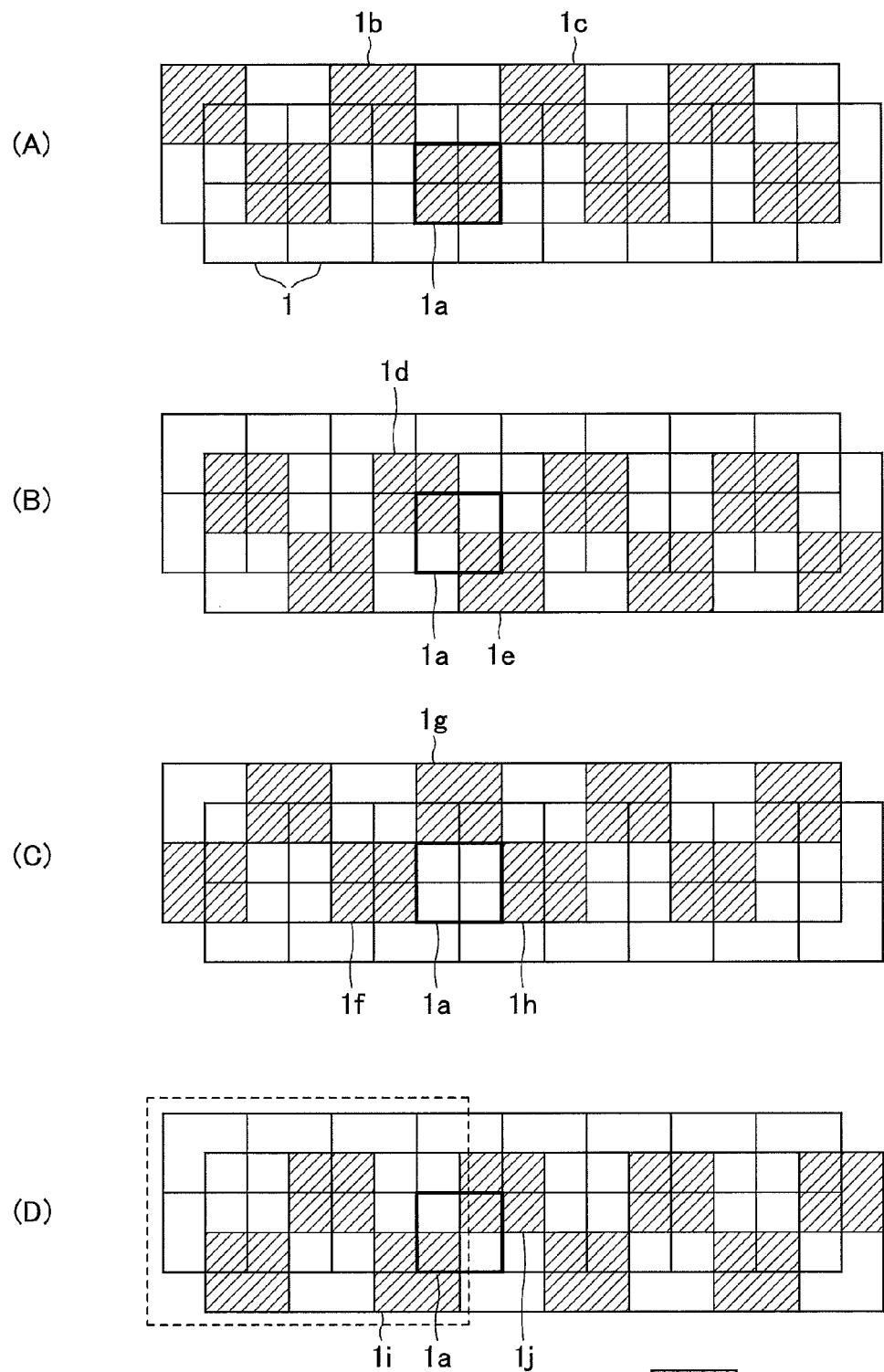
FIG. 3 is a schematic diagram for describing an example of a method for switching coils used for communication.
Figure 3:
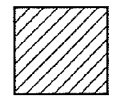

As illustrated in FIG. 3, each coil is switched between active coils (Active Channel) that are used for communication and an inactive coil 11*a* (Inactive channel) that is not used for communication at corresponding timings θ. Thereby, cross-talk between active coils can at least be prevented. FIG. 3 illustrates that the coils used for communication are switched at 4 phase timings. FIG. 3(A) illustrates a first phase timing ($\theta=0$), FIG. 3B illustrates a second phase timing ($\theta=\pi/2$), FIG. 3C illustrates a third phase timing ($\theta=\pi$), and FIG. 3D illustrates a fourth phase timing ($\theta=3\pi/2$).

In FIG. 3, 32 quadrangles that are depicted at each phase timing θ schematically respectively represent a single coil 1 illustrated in FIGS. 1 and 2 and respectively represent a coil arranged to partly overlap in a diagonal direction. Eight active coils are selected at each phase timing.

An example of a single coil 1*a* among the 32 coils is described as a target coil. A first mode is executed at the first phase timing (θ=0) in which the coil 1*a* is used for communication and other coils 1*b*, 1*c* that do not overlap with the coil 1*a* in the diagonal direction of the coil 1*a* are also used for communication. A second mode is executed at the second phase timing (θ=0) in which the coil 1*a* is not used for communication whereas other coils 1*d*, 1*e* that partly overlap with the coil 1*a* in a first diagonal direction connecting the corners of the coil 1*a* are used for communication. A third mode is executed at the third phase timing (θ=π) in which the coil 1*a* is not used for communication whereas other coils 1*f*, 1*g*, 1*h* respectively having a side opposing one of the sides of the coil 1*a* are used for communication. The fourth mode is executed at the fourth phase timing (θ=3π/2) in which the coil 1*a* is not used for communication whereas other coils 1*i*, 1*j* that partly overlap with the coil 1*a* in a second diagonal direction connecting the corners of the coil 1*a* are used for communication.

Because multiple coils that partly overlap in diagonal directions connecting their corners can be formed on the substrate 60, many coils can be arranged in a relatively small area. For example, multiple coils that are partly overlapped in their diagonal directions can be arranged on a relatively small area in the vicinity of a memory array region of a memory chip (vicinity at which an input/output circuit for inputting/outputting signals with respect to a memory array).

Figure 4:
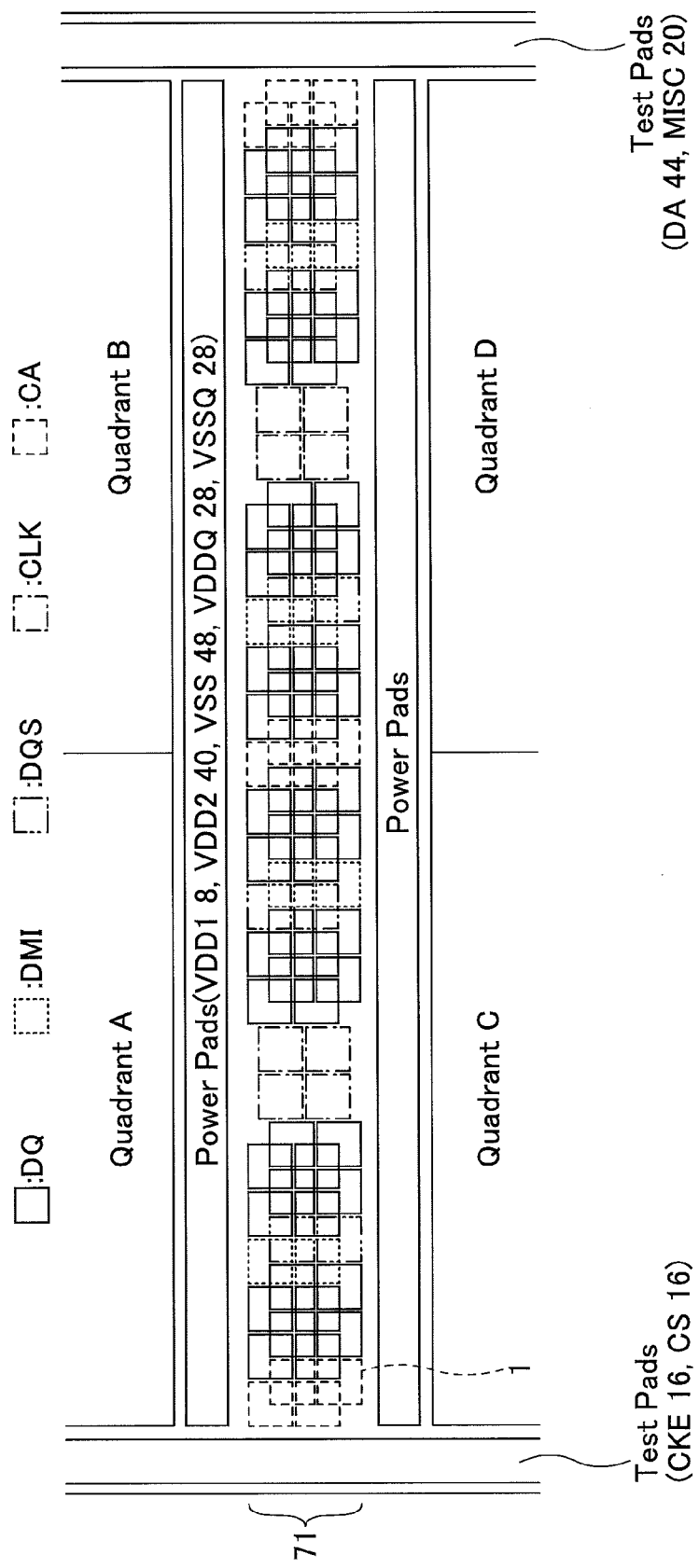
FIG. 4 is a schematic diagram illustrating an exemplary configuration of a memory chip.

FIG. 4 is a schematic diagram illustrating an exemplary configuration of a DRAM chip which is one example of a memory chip. Multiple coils (100 coils in the example of FIG. 4) that are partly overlapped in the diagonal direction can be arranged in a peripheral region 71 at the center of the DRAM chip. Each of the quadrangles depicted in FIG. 4 schematically represent the coil 1 illustrated in FIGS. 1 and 2.

92 coils for data transmission and 8 coils for clock (CLK) transmission are arranged in the peripheral region 71. The 92 coils for data transmission may be broken down to, for example, 64 coils for data signal (DQ signal) transmission, 8 coils for DMI transmission, 8 coils for data strobe signal (DQS signal) transmission, and 12 coils for CA transmission. The quadrants A, B, C, and D represent memory cell regions, respectively.

Figure 5:
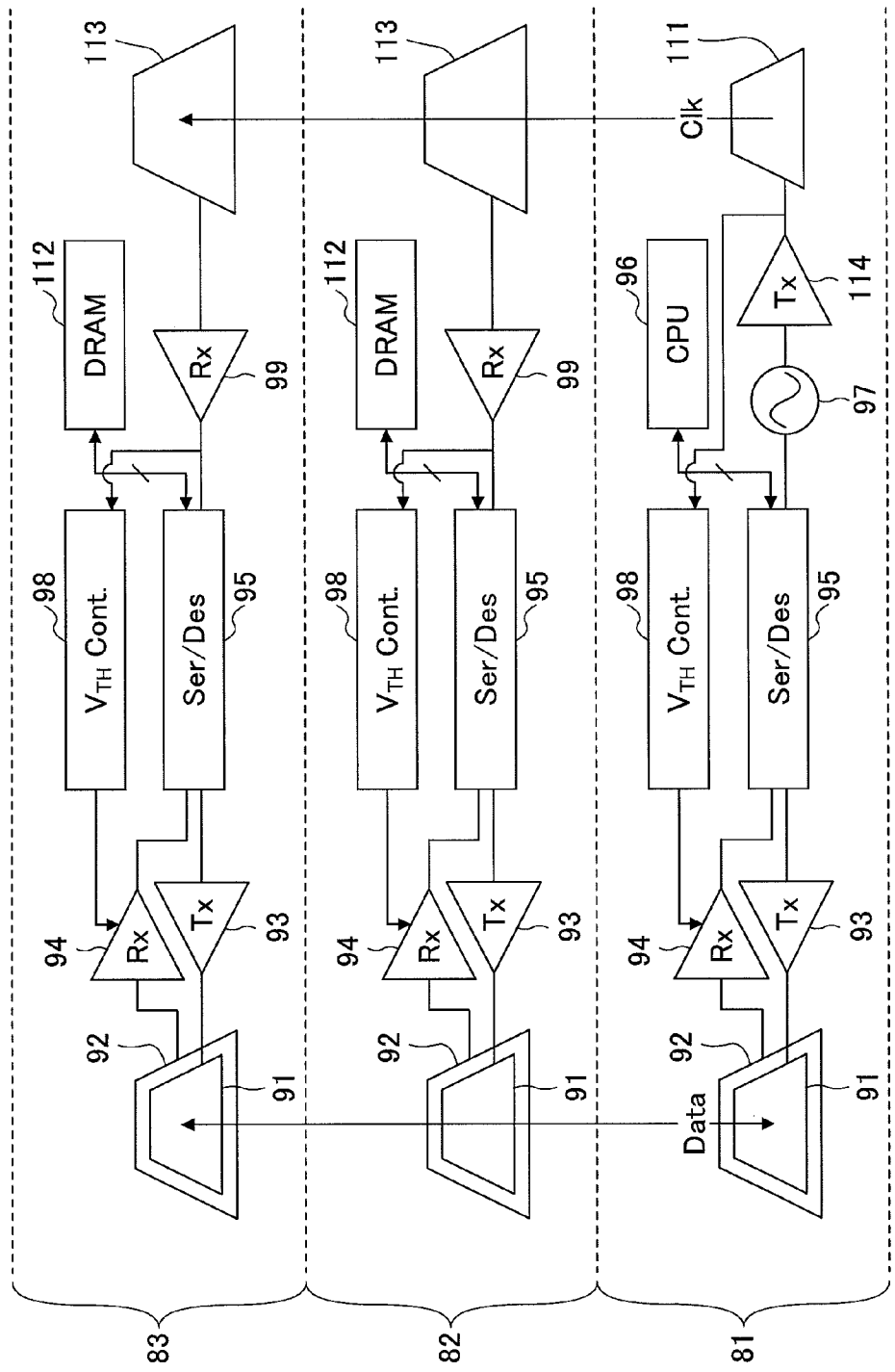
FIG. 5 is a schematic diagram illustrating an exemplary configuration of a layered circuit including multiple layers of chips.

FIG. 5 is a schematic diagram illustrating an exemplary configuration of a layered circuit 201 including multiple layers of chips. The layered circuit 201 includes a control chip 81, a memory chip 82, and a memory chip 83 that are layered on top of each other. Communication between these chips are performed by the inductive coupling of the coils 1 (see FIG. 2) constituting these chips. Each of the control chip 81, the memory chip 82, and the memory chip 83 is an example of a semiconductor integrated circuit.

The control chip 81 includes a receiver coil 92 and a transmitter coil 91 arranged at the inner side of the receiver coil 92. The transmitter coil 91 has a figure that is similar to but reduced a predetermined scale relative to the receiver coil 92, so that the transmitter coil 91 can be arranged at the inner side of the receiver coil 92. Although not illustrated in FIG. 1, the transmitter coil 91 is arranged at the inner side of the receiver coil 92 in a case where one of the coils illustrated in FIG. 1 is the receiver coil 92. The same applies to the transmitter coil 91 and the receiver coil 92 in each of the memory chips 82, 83.

The transmitter coil 91 of the control chip 81, the receiver coil 92 of the control chip 81, the transmitter coil 91 of the memory chip 82, the receiver coil 92 of the memory chip 82, the transmitter coil 91 of the memory chip 82, and the receiver coil 92 of the memory chip 83 are arranged at distances that allow inductive coupling between each other.

The control chip 81 includes a transmitter coil 111 for clock (CLK) transmission. Each of the memory chips 82, 83 includes a receiver coil 113 for clock transmission (CLK). The transmitter coil 111 of the control chip 81, the receiver coil 113 of the memory chip 82, and the receiver coil 113 of the memory chip 83 are arranged at distances that allow inductive coupling between each other. The transmitter coil 111 and the receiver coil 113 may have a wiring structure formed by multiple layers or a wiring structure formed by a single layer.

For example, parallel data extracted from each DRAM 112 is converted into serial data at a ratio of 8:1 by a Ser/Des circuit 95. The transmitter 93 uses the transmission coil 91 to transfer the converted serial data to the receiver coil 92 of a chip besides a chip of itself (target chip).

The four phase clock CLK for data transmission is generated by the CPU 96 and the clock circuit 97 of the control chip 81. The transmitter 114 transfers the clock CLK generated by the control chip 81 to each of the receiver coils 113 of the memory chips 82, 83 by way of the transmitter coil 111 of the control chip 81. The clock CLK transferred to each of the receiver coils 113 of the memory chips 82, 83 is transmitted to the Ser/Des circuit 95 by way of the receiver 99. Therefore, generation of a clock CLK is not required in the memory chips 82, 83.

As illustrated in FIG. 3, cross-talk between communicating coils can be prevented by switching the coils according to a phase division multiplexing method. However, when a target coil is not performing transmission or reception, a reception error may occur in the receiver 94 connected to the target coil (see FIG. 5) due to cross-talk between other coils surrounding the target coil. In a case where the electric power of the receiver 94 is switched off in accordance with the phase θ, the receiver 94 cannot retain its received data. Therefore, in order to prevent reception error due to cross-talk when the target coil is not communicating, it is preferable to provide a threshold controller 98 so that a reception sensitivity of the receiver 94 (threshold of detected reception signal from the reception coil) can be adjusted in accordance with phase θ. The threshold controller 98 is provided in each of the control chip 81, the memory chip 82, and the memory chip 83.

Figure 6:
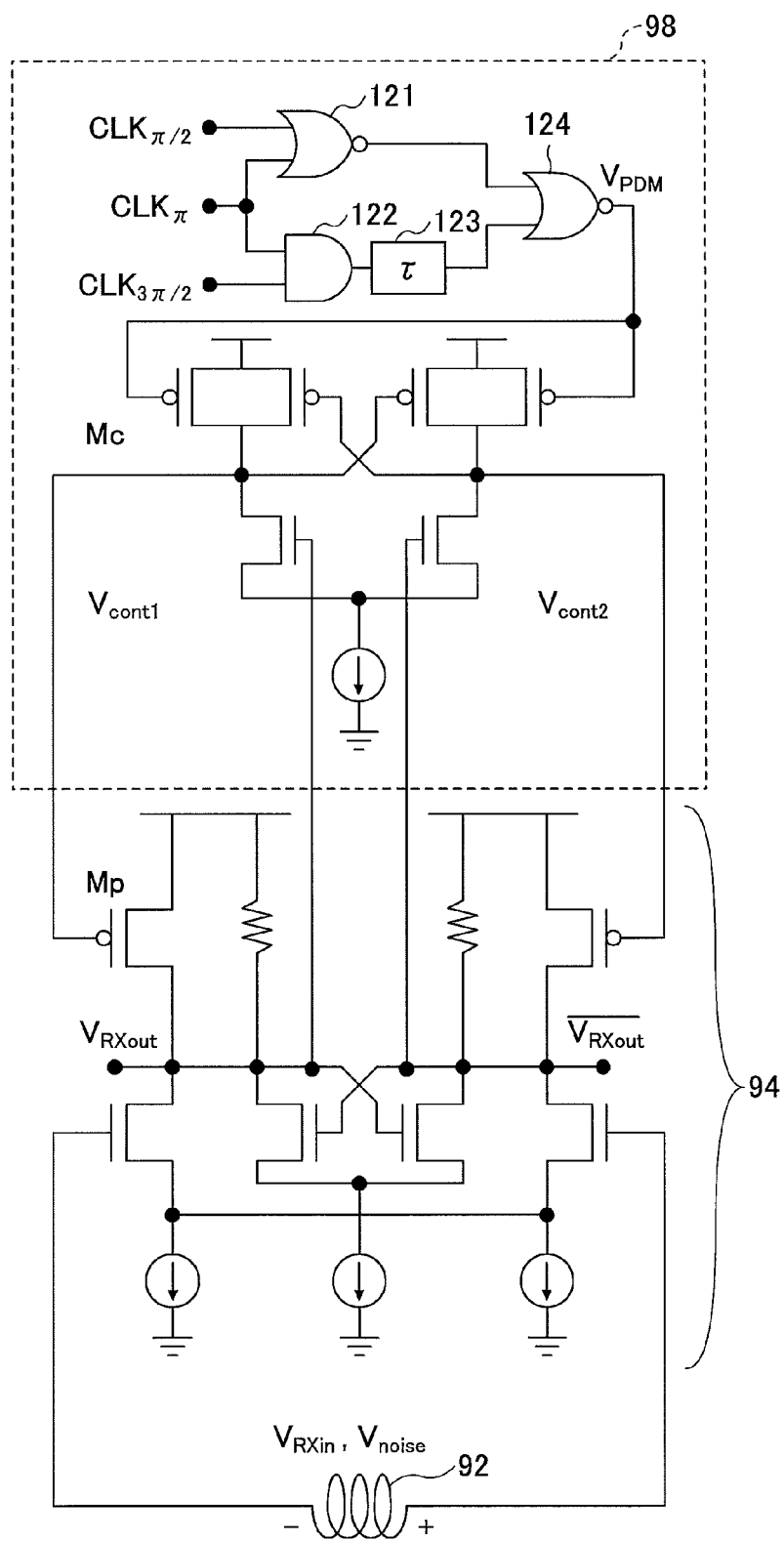
FIG. 6 is a schematic diagram illustrating an exemplary configuration of a threshold control circuit for controlling a detection threshold of a signal received from a coil.

FIG. 6 illustrates an exemplary configuration of the threshold controller 98 that adjusts the hysteresis of the detection threshold $V_{TH}$ of the receiver 94 in accordance with phase θ. The threshold controller 98 is an example of a threshold control circuit that controls the detection threshold $V_{th}$ of the reception signal obtained from the receiver coil that has started or ended being used for communication.

Figure 7:
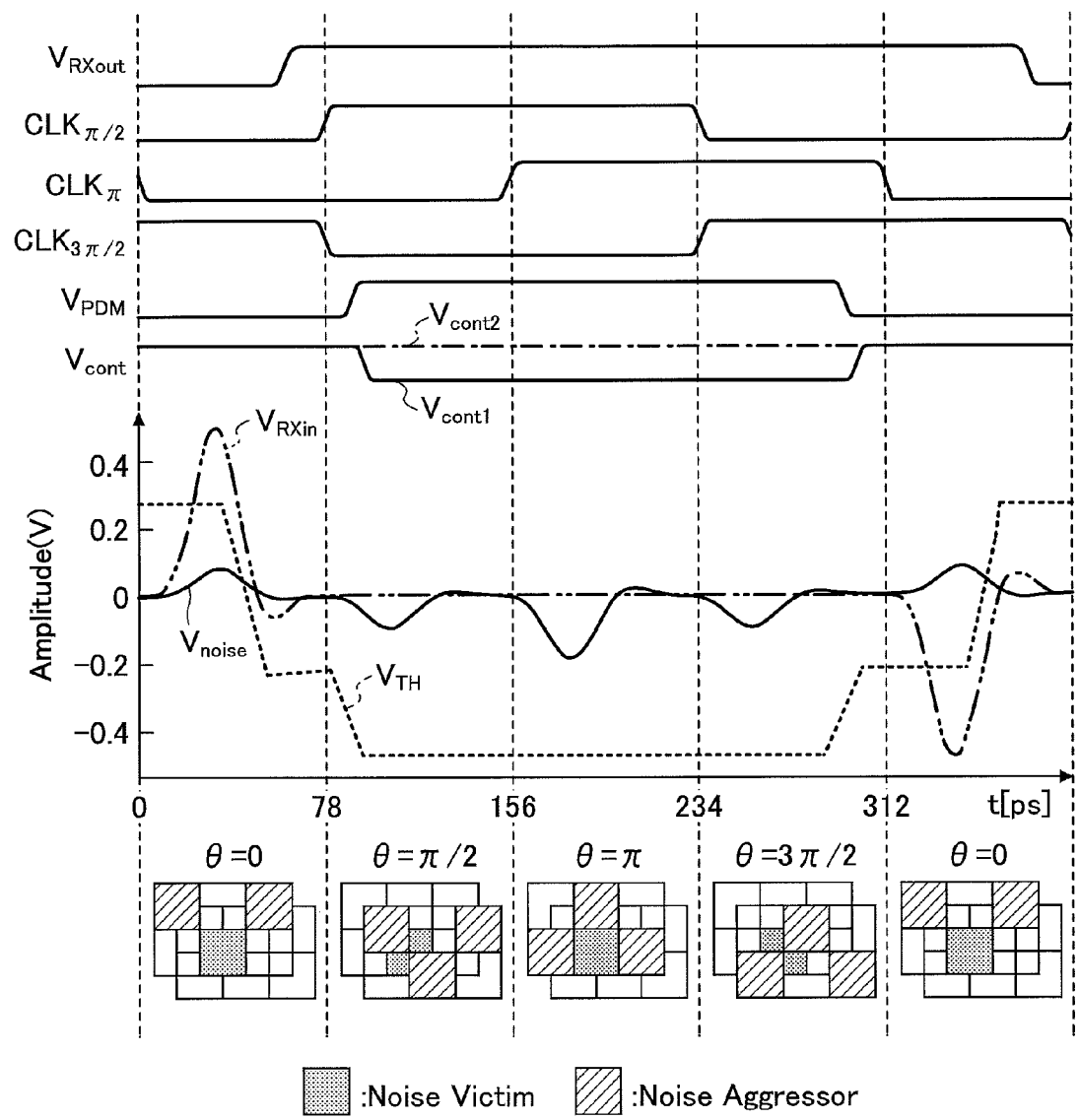
FIG. 7 is a schematic diagram for describing an example of an operation for controlling a detection threshold with a threshold control circuit.

FIG. 7 is a diagram for explaining an exemplary operation of controlling the detection threshold $V_{TH}$ with the threshold controller 98. In explaining the operation of controlling the detection threshold $V_{th}$, one coil (Noise Victim) that communicates in the phase θ=0 is first explained. When θ=0, the amplitude $V_{noise}$ of the noise that the one coil (Noise Victim) receives by the cross-talk of its surrounding coils (Noise Aggressor) communicating at the same phase (i.e., θ=0) is significantly smaller than the detection threshold $V_{th}$. This is because the coil (Noise Aggressor) positioned adjacent to the one coil (Noise Victim) in a diagonal direction of the one coil has a relatively small magnetic field strength when θ=0. The same applies when θ=π/2 and when θ=3π/2.

On the other hand, when θ=π, the absolute value of the noise amplitude $V_{noise}$ is greatest. This is because the coil (Noise Aggressor) positioned adjacent to the one coil (Noise Victim) in a direction in which the wiring of the one coil extends has a relatively large magnetic field strength when θ=π.

Therefore, in order to prevent a reception error of the receiver 94 connected to the coil (Noise Victim), the threshold controller 98 increases the absolute value of the detection threshold $V_{TH}$ so that the reception sensitivity of the receiver 94 is lowered.

For example, the threshold controller 98 controls each mode, so that the first mode, the second mode, the third mode, and the fourth mode are repeated in this order. Thereby, the timing in which the absolute value of the noise amplitude $V_{noise}$ becomes largest can be separated as much as possible from the timing in which the one coil (Noise Victim) receives a signal. As a result, reception error of the receiver connected to the one coil (Noise Victim) can be positively prevented.

The threshold controller 98 increases the absolute value of the detection threshold $V_{th}$ during a period in which a control signal $V_{PDM}$ (generated according to clocks $CLK_{\pi/2}$, $CLK_{\pi}$, $CLK_{3\pi/2}$ of different phases θ as illustrated in FIG. 6) is maintained at a high level (see FIG. 7), so that the reception sensitivity of the receiver 94 is lowered. The logic circuit including a combination of NOR circuits 121, 124, an AND circuit 122, and a delay circuit 123 generates the control signal $V_{PDM}$ based on the three clocks $CLK_{\pi/2}$, $CLK_{\pi}$, $CLK_{3\pi/2}$.

As illustrated in FIG. 6, the receiver 94 is a comparator with hysteresis caused by a cross-coupled NMOS transistor and a PMOS transistor Mp. The threshold controller 98 is connected to the output of the receiver 94 and retains output data of the receiver 94. The retained output data synchronizing with the phase θ (=π/2) input to the PMOS transistor Mc determines the gate potential of the PMOS transistor Mp. Because hysteresis becomes stronger while retaining the output data of the receiver 94 during the period where σ=π/2 to 3π/2, the output data of the receiver 94 can be protected from the noise amplitude $V_{noise}$. The threshold controller 98 lowers the detection threshold Vth to its initial value at the timing where θ=2π (θ=0).

Although an embodiment of an integrated circuit and layered circuit including the integrated circuit is described above, the present invention is not limited to the embodiments explained heretofore, but variations and modifications may be made without departing from the scope of the invention.

For example, the number of windings of the coil may be singular or plural. Further, the position of the coil end (end part of coil) is arbitrary. The shape of the coil may be a quadrate, rectangle, or a parallelogram. The number of other coils having partly overlapping corners in a direction diagonal to the target coil may be any of 1, 2, 3, 4, or 5 or more.

Although four (first to fourth) modes are described in the above-described embodiment, the types of modes are not limited to four modes. The number of modes may be determined in accordance with the number of other coils having partly overlapping corners in a direction diagonal to the target coil.

The present application is based on Japanese Priority Application No.2013-241386 filed on Nov. 21, 2013, with the Japanese Patent Office, the entire contents of which are hereby incorporated by reference.

EXPLANATION OF REFERENCE NUMERALS 1, 1-1 to 1-12 coil
11, 12, 13, 14, 15 first wiring
21, 22, 23, 24 second wiring
31, 32, 33, 34, 35, 36, 37 via
40 imaginary line
41 first wiring layer
42 second wiring layer
51, 52 coil end
60 substrate
71 peripheral region
81 control chip
82, 83 chip
98 threshold controller
101 semiconductor integrated circuit
121, 124 NOR circuit
122 AND circuit
123 delay circuit
201 layered circuit

The invention claimed is:

1. An integrated circuit comprising:
a plurality of quadrangular coils, each of the plurality of quadrangular coils including a first wiring and a second wiring that are alternately connected to each other,
wherein the first wiring is formed on a first layer and the second wiring is formed on a second layer situated over the first layer, such that the first wiring perpendicularly intersects the second wiring in a plan view,
wherein the coils are partly overlapped with each other in a diagonal direction that connects opposite corners of the coils, and
wherein the coils include a first coil and a second coil partly overlapped with each other in the diagonal direction, and a corner of the first coil and a corner of the second coil are entangled with each other such that the first wiring and the second wiring extending from the corner of the first coil are situated under the second wiring and over the first wiring, respectively, extending from the corner of the second coil.

2. The integrated circuit as claimed in claim 1, wherein the coils have the same structures.

3. The integrated circuit as claimed in claim 1, wherein a target coil among the coils partly overlaps with another coil among the coils in two diagonal directions that connect opposite corners of the target coil.

4. The integrated circuit as claimed in claim 1, wherein whether to use the coils for communication is switched according to a phase timing.

5. An integrated circuit comprising:
a plurality of quadrangular coils, each of the plurality of quadrangular coils including a first wiring and a second wiring that are alternately connected to each other,
wherein the first wiring is formed on a first layer and the second wiring is formed on a second layer situated over the first layer, such that the first wiring perpendicularly intersects the second wiring in a plan view,
wherein the coils are partly overlapped with each other in a diagonal direction that connects opposite corners of the coils,
wherein whether to use the coils for communication is switched according to a phase timing, and
wherein
a mode of using a target coil among the coils for communication and using another coil among the coils that is arranged in a position that does not overlap with the target coil in a diagonal direction connecting opposite corners of the target coil for communication,
a mode of not using the target coil for communication and using another coil that is arranged in a position that overlaps with the target coil in a diagonal direction connecting opposite corners of the target coil for communication, and
a mode of not using the target coil for communication and using another coil having opposite sides opposing a side of the target coil,
are switched according to the phase timing.

6. An integrated circuit comprising:
a plurality of quadrangular coils, each of the plurality of quadrangular coils including a first wiring and a second wiring that are alternately connected to each other,
wherein the first wiring is formed on a first layer and the second wiring is formed on a second layer situated over the first layer, such that the first wiring perpendicularly intersects the second wiring in a plan view,
wherein the coils are partly overlapped with each other in a diagonal direction that connects opposite corners of the coils,
wherein whether to use the coils for communication is switched according to a phase timing, and
wherein
a first mode of using a target coil among the coils for communication and using another coil among the coils that is arranged in a position that does not overlap with the target coil in a diagonal direction connecting opposite corners of the target coil for communication,
a second mode of not using the target coil for communication and using another coil that is arranged in a position that overlaps with the target coil in a diagonal direction connecting one of the opposite corners of the target coil for communication,
a third mode of not using the target coil for communication and using another coil having opposite sides opposing a side of the target coil, and
a fourth mode of not using the target coil for communication and using another coil that is arranged in a position that overlaps with the target coil in a diagonal direction connecting another one of the opposite corners of the target coil for communication, are switched according to the phase timing.

7. The integrated circuit as claimed in claim 6, wherein the first mode, the second mode, the third mode, and the fourth mode are repeated in this order.

8. The integrated circuit as claimed in claim 4, further comprising:
a threshold control circuit that controls a detection threshold of a reception signal obtained from the coils that have started or ended being used for communication according to a timing for ending or starting the use of the coils for communication.

9. A layered circuit comprising:
a plurality of layers of the integrated circuit of claim 1;
wherein one integrated circuit and another integrated circuit communicate by inductive coupling between the coil included in the one integrated circuit and the coil included in the other integrated circuit.

* * * * *